(12) United States Patent
Yamashita et al.

(10) Patent No.: US 8,882,962 B2
(45) Date of Patent: Nov. 11, 2014

(54) PLASMA PROCESSING APPARATUS

(75) Inventors: Jun Yamashita, Amagasaki (JP); Kazuhiro Isa, Amagasaki (JP); Hideo Nakamura, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/075,557

(22) Filed: Mar. 30, 2011

(65) Prior Publication Data
US 2011/0174441 A1 Jul. 21, 2011

Related U.S. Application Data

(63) Continuation of application No. PCT/JP2009/066925, filed on Sep. 29, 2009.

(30) Foreign Application Priority Data

Sep. 30, 2008 (JP) .................................. 2008-253929

(51) Int. Cl.
| | |
|---|---|
| C23C 16/00 | (2006.01) |
| C23F 1/00 | (2006.01) |
| H01L 21/306 | (2006.01) |
| C23C 16/44 | (2006.01) |
| H01J 37/32 | (2006.01) |
| C23C 16/509 | (2006.01) |
| C23C 16/455 | (2006.01) |

(52) U.S. Cl.
CPC ....... *H01J 37/32559* (2013.01); *C23C 16/4404* (2013.01); *C23C 16/5096* (2013.01); *H01J 37/32192* (2013.01); *C23C 16/45565* (2013.01)
USPC .............................. 156/345.41; 118/723 MW

(58) Field of Classification Search
USPC ......... 118/723 MW, 723 R, 724; 156/345.41, 156/345.37; 315/111.71
See application file for complete search history.

(56) References Cited

U.S. PATENT DOCUMENTS

| | | | |
|---|---|---|---|
| 5,134,965 A * | 8/1992 | Tokuda et al. ........ 118/723 MW |
| 5,846,885 A | 12/1998 | Kamata et al. | |

(Continued)

FOREIGN PATENT DOCUMENTS

| | | |
|---|---|---|
| JP | 7-335631 | 12/1995 |
| JP | 9-120957 | 5/1997 |

(Continued)

OTHER PUBLICATIONS

Japanese International Search Report mailed Nov. 2, 2009 in PCT/JP2009/066925 filed Sep. 29, 2009 (with English Translation).

*Primary Examiner* — Rakesh Dhingra
(74) *Attorney, Agent, or Firm* — Oblon, Spivak, McClelland, Maier & Neustadt, L.L.P.

(57) ABSTRACT

Provided is a plasma processing apparatus wherein an electrode embedded in a mounting table is supplied with high frequency power for biasing. A surface, which is exposed to plasma and is of an aluminum cover functioning as an opposite electrode to the electrode of the mounting table, is coated with a protection film, preferably a $Y_2O_3$ film. A second portion forming an upper side portion of the processing chamber and a first portion forming a lower side portion of the processing container are provided with an insulating upper liner and an insulating lower liner thicker than the upper liner, respectively. Thus, undesirable short-circuits and abnormal electrical discharge are prevented and stable high-frequency current path is formed.

11 Claims, 5 Drawing Sheets

(56) References Cited

U.S. PATENT DOCUMENTS

| | | | |
|---|---|---|---|
| 5,885,356 A * | 3/1999 | Zhao et al. | 118/723 ER |
| 6,092,486 A * | 7/2000 | Mabuchi et al. | 118/723 MW |
| 6,170,429 B1 * | 1/2001 | Schoepp et al. | 118/723 R |
| 6,646,224 B2 * | 11/2003 | Ishii et al. | 219/121.43 |
| 7,897,009 B2 | 3/2011 | Sasaki | |
| 2003/0066482 A1 * | 4/2003 | Pokharna et al. | 118/696 |
| 2004/0250771 A1 * | 12/2004 | Ozaki et al. | 118/723 MW |
| 2005/0147852 A1 * | 7/2005 | Harada et al. | 428/702 |
| 2007/0238307 A1 | 10/2007 | Yamashita | |
| 2007/0264441 A1 | 11/2007 | Ishibashi et al. | |
| 2008/0142159 A1 | 6/2008 | Sasaki | |
| 2009/0133835 A1 * | 5/2009 | Nishimoto et al. | 156/345.27 |
| 2010/0012275 A1 * | 1/2010 | Yamashita | 156/345.41 |

FOREIGN PATENT DOCUMENTS

| | | | | |
|---|---|---|---|---|
| JP | 2001-148372 | | 5/2001 | |
| JP | 2005-268763 | | 9/2005 | |
| JP | 2006-332554 | * | 12/2006 | C23C 16/511 |
| JP | WO2007/046414 | * | 4/2007 | C23C 16/00 |
| JP | 2007-250568 | | 9/2007 | |
| KR | 10-2007-0058695 A | | 6/2007 | |
| KR | 10-2008-0079339 | | 8/2008 | |
| WO | WO 2006/064898 A1 | | 6/2006 | |

* cited by examiner

PLASMA PROCESSING APPARATUS

CROSS-REFERENCE TO RELATED APPLICATION

This application is a Continuation Application of PCT International Application No. PCT/JP2009/066925 filed on Sep. 29, 2009, which designated the United States.

FIELD OF THE INVENTION

The present invention relates to a plasma processing apparatus for performing a plasma process on a target object such as a semiconductor wafer or the like.

BACKGROUND OF THE INVENTION

In manufacturing a semiconductor device, various processes such as etching, ashing, film formation and the like are performed on a semiconductor wafer as a target object. Such processes are carried out by using a plasma processing apparatus for performing a plasma process on a semiconductor wafer in a processing chamber that can be maintained at a vacuum atmosphere. In the plasma processing apparatus, an inner wall of the processing chamber is made of a metal such as aluminum or the like. Therefore, when a surface of the inner wall is exposed to a strong plasma, it is sputtered by bombardments of ions in the plasma to thereby generate particles. Accordingly, metal contamination is caused by the aluminum or the like, which has an adverse effect on device performance.

In order to solve the above-described problem, there has been suggested a technique for coating yttrium oxide on a portion exposed to a plasma in a processing chamber in an RLSA microwave plasma processing apparatus in which a plasma is generated by supplying microwave into the processing chamber by using a planar antenna (see, e.g., Japanese Patent Application Publication No. 2005-268763).

Meanwhile, along with the recent trend toward scaling up of a semiconductor wafer and miniaturization of devices, it is required to improve efficiency of the plasma process (e.g., film forming rate) and in-plane wafer surface processing uniformity. Hence, a method for performing a plasma process while applying a bias to a semiconductor wafer on a mounting table by supplying a high frequency power to an electrode which is embedded in the mounting table made of a dielectric material in a processing chamber of a plasma processing apparatus has been attracting attention in a film forming process represented by a plasma oxidation process.

When the high frequency power is supplied to the electrode of the mounting table, an opposite electrode needs to be provided in the processing chamber with a plasma processing space therebetween. The opposite electrode is preferably made of a conductive metal. In the plasma oxidation process, a plasma having strong oxidizing ability is generated near the opposite electrode, so that the surface of the opposite electrode is oxidized and degraded. In addition, the surface of the opposite electrode is sputtered, which results in metal contamination or particle generation.

Further, when the high frequency power is supplied to the electrode of the mounting table, a path of the high frequency current (RF return circuit) is formed, i.e., the high frequency current flows from the mounting table to the opposite electrode via the plasma processing space and then flows back from the opposite electrode to the earth of the high frequency power supply via the wall or the like of the processing chamber. If a stable high frequency current path is not formed, the plasma generated in the processing chamber becomes unstable. Furthermore, the power consumption efficiency of the high frequency power is decreased, so that the bias cannot be stably applied.

Moreover, if a short-circuit or an abnormal discharge occurs in the high frequency current path, the processing efficiency is decreased and the process becomes unstable. For example, if a short-circuit occurs on the high frequency current path such that the high frequency power flows toward the sidewall of the processing chamber which is relatively closely located instead of flowing toward the opposite electrode via the plasma processing space from the mounting table, the power consumption efficiency of the high frequency power is decreased and, also, the processing efficiency is decreased.

SUMMARY OF THE INVENTION

In view of the above, the present invention provides a technique for improving power consumption efficiency by stabilizing a high frequency current path and improving processing efficiency by preventing abnormal discharge in a plasma processing apparatus in which a high frequency bias power is supplied to an electrode of a mounting table for mounting thereon a target object.

In accordance with a first aspect of the present invention, there is provided a plasma processing apparatus including: a processing chamber having an opening at an upper portion thereof; a gas supply mechanism for supplying a processing gas into the processing chamber; a gas exhaust mechanism for exhausting while depressurizing the inside of the processing chamber; a mounting table for mounting thereon a target object in the processing chamber; a first electrode embedded in the mounting table, for applying a bias to the target object; and a second electrode disposed at least partially to be exposed to a plasma generation space in the processing chamber, to be located apart from the first electrode by a plasma processing space and made of a conductive member.

Further, the plasma processing apparatus includes a dielectric plate supported by the second electrode, for blocking the opening of the processing chamber while transmitting a microwave; and a planar antenna, provided above the dielectric plate and connected to a microwave generator via a waveguide, for introducing a microwave into the processing chamber.

In the plasma processing apparatus, a protection film made of metal oxide is formed at a portion of a surface of the second electrode which faces the plasma generation region. Moreover, an upper inner wall surface of the processing chamber is covered by a first insulating liner and a lower inner wall surface of the processing chamber is covered by a second insulating liner.

With the above configuration, the protection film made of metal oxide protects the surface of the second electrode (opposite electrode) made of a conductive material such as a metal or the like. Accordingly, the durability of the opposite electrode can be improved, and the opposite electrode can be protected from the plasma for a long period of time.

While the high frequency current flows into the second electrode and is transmitted to the lower portion of the processing chamber via the sidewall thereof the processing chamber, occurrence of abnormal discharge from the mounting table to the sidewall of the processing chamber is prevented by the first and the second insulating liner so that the high frequency current path can be stably maintained without power loss (resistance).

Thus, the power consumption efficiency of the high frequency power supplied to the electrode of the mounting table can be improved, and adverse effects of the abnormal discharge on the process can avoided. Moreover, it is possible to prevent metal contamination and damages to the processing chamber caused by occurrence of particles. As a result, the plasma processing can be stably carried out.

Preferably, a thickness of the second insulating liner is greater than a thickness of the first insulating liner.

The second insulating liner preferably covers at least a part of an inner wall surface of the processing chamber which is located lower than the mounting table in which the first electrode is embedded. More preferably, the second insulating liner extends to a height position corresponding to a gas exhaust chamber connected to a bottom portion of the processing chamber.

In an preferred embodiment, the processing chamber has a first portion forming a lower portion of the processing chamber, and a second portion connected to a top end surface of the first portion and forming an upper portion of the processing chamber; a gas passage through which the processing gas supplied from the gas supply unit to the processing chamber flows is formed between the first portion and the second portion; a first sealing member and a second sealing member are provided radially at both sides of the gas passage; and the first portion and the second portion are adhered to each other at the portion where the first sealing member close to the inside of the processing chamber is provided, and are separated from each other with a gap at the portion where the second sealing member close to the outside of the processing chamber is provided.

Preferably, the protection film is made of yttrium oxide.

Preferably, the dielectric plate, the first insulating liner and the second insulating liner are made of quartz.

DETAILED DESCRIPTION OF THE EMBODIMENT

Figure 1:
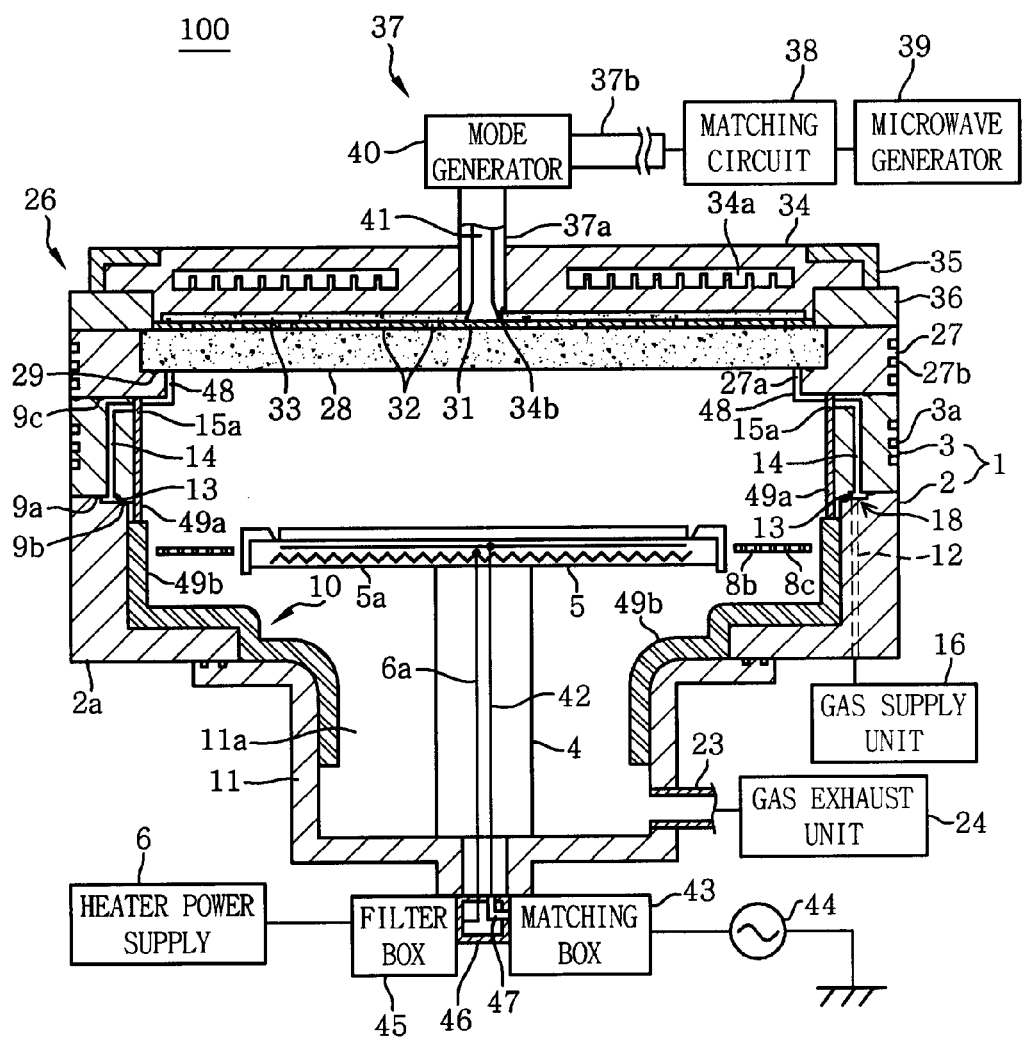
FIG. 1 is a schematic cross sectional view of a plasma oxidation processing apparatus in accordance with an embodiment of a plasma processing apparatus of the present invention.
Figure 2:
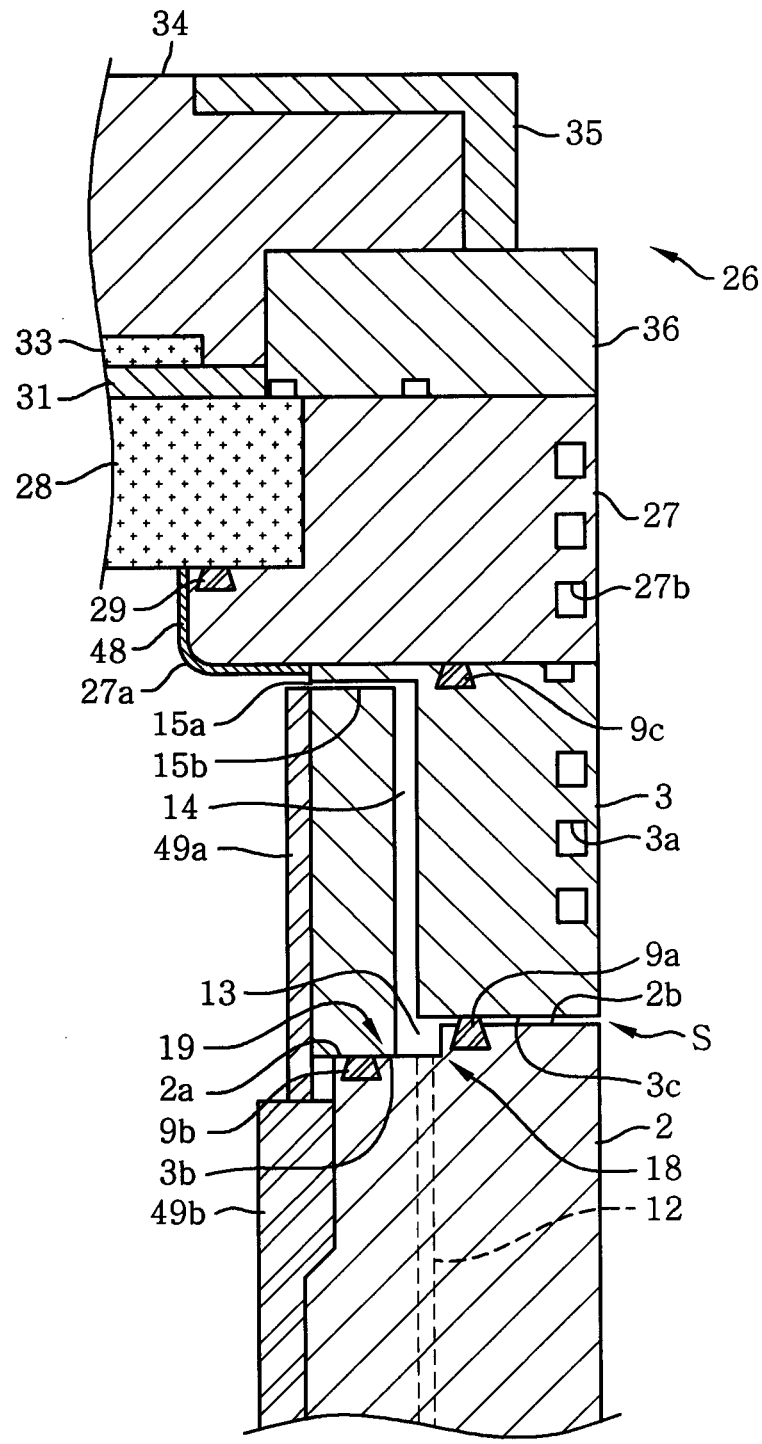
FIG. 2 is an enlarged cross sectional view of principal parts of the plasma oxidation processing apparatus shown in FIG. 1.
Figure 3:
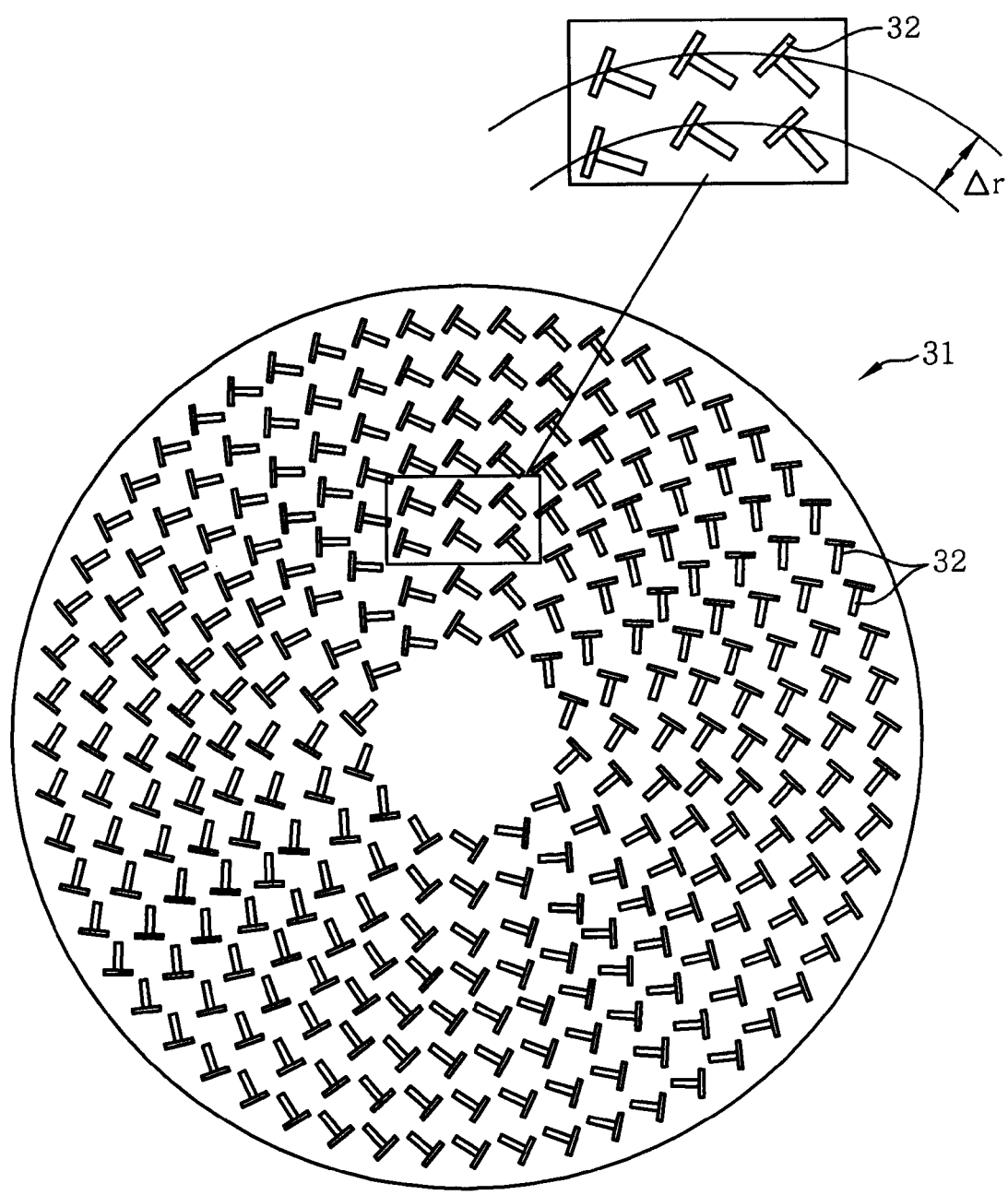
FIG. 3 shows a structure of a planar antenna.

Hereinafter, an embodiment of the present invention will be described in detail with reference to the accompanying drawings. FIG. 1 is a cross sectional view showing a schematic configuration of a plasma oxidation processing apparatus 100 in accordance with an embodiment of a plasma processing apparatus of the present invention. FIG. 2 is an enlarged cross sectional view of principal parts of the plasma oxidation processing apparatus shown in FIG. 1. FIG. 3 is a top view of a planar antenna used in the plasma oxidation processing apparatus 100 shown in FIG. 1.

The plasma oxidation processing apparatus 100 includes an RLSA microwave plasma processing apparatus capable of generating a microwave-excited plasma of a high density and a low electron temperature by introducing a microwave into a processing chamber by using a planar antenna having a plurality of slot-shaped holes, particularly, an RLSA (Radial Line Slot Antenna). The plasma oxidation processing apparatus 100 can perform a process using a plasma having a density of about $1 \times 10^{10}$ to $5 \times 10^{12}/cm^2$ and a low electron temperature of about 0.7 to 2 eV. Therefore, the plasma oxidation processing apparatus 100 can be preferably used to form a silicon oxide film (e.g., $SiO_2$ film) by oxidizing, e.g., silicon of a target object, in the process of manufacturing various semiconductor devices.

The plasma oxidation processing apparatus 100 includes an approximately cylindrical processing chamber 1 to which a semiconductor wafer (hereinafter, simply referred to as a "wafer") serving as a substrate is loaded. The processing chamber 1 is airtightly sealed and grounded. Further, the processing chamber 1 is made of a metal such as aluminum, aluminum alloy, stainless steel or the like.

The processing chamber 1 includes a first portion (hereinafter, referred to as a "first chamber 2") forming a lower portion of the processing chamber 1 and a second portion (hereinafter, referred to as a "second chamber 3") provided above the first portion and forming an upper portion of the processing chamber 1. The first chamber 2 and the second chamber 3 may be formed as one unit.

Moreover, a microwave introducing unit 26 for introducing a microwave into the processing space is detachably provided at the upper portion of the processing chamber 1. In other words, an upper opening of the processing chamber 1 can be opened and closed by the microwave introducing unit 26. The upper portion of the second chamber 3 is engaged with the microwave introducing unit 26, and the lower portion of the second chamber 3 is connected to the upper portion of the first chamber 2.

Further, a plurality of cooling water paths 3a is formed at the second chamber 3 to cool the wall of the second chamber 3. Accordingly, it is possible to prevent plasma damages and misalignment of the connection portion from occurring due to thermal expansion caused by the heat of the plasma. Further, degradation of sealability and generation of particles are prevented.

In the first chamber 2, a mounting table 5 for horizontally supporting a wafer W serving as a target object is supported by a cylindrical support 4 installed to be upwardly extended at a center of a bottom portion of a gas exhaust chamber 11. Although the mounting table 5 and the support 4 may be made of quartz, ceramic such as AlN, $Al_2O_3$ or the like, it is preferable to use AlN having good thermal conductivity.

Further, a resistance heater 5a is buried in the mounting table 5 and powered by a heater power supply 6 so that the mounting table 5 is heated to thereby heat the wafer W, the heater power supply 6 supplying an alternate current (AC) power of, e.g., about 200 V. A filter box 45 having a noise filter circuit for blocking a radio-frequency wave (RF) noise is provided in a power supply line 6a for connecting between the heater 5a and the heater power supply 6.

The temperature of the mounting table 5 is measured by a thermocouple (not shown) inserted in the mounting table 5. The heater power supply 6 is controlled based on a signal from the thermocouple, and the temperature thereof can be stably controlled to be maintained between a room temperature and about 800° C., for example.

A bias electrode 7 serving as a first electrode is embedded at a surface side inside the mounting table 5. The electrode 7 is embedded in a location substantially corresponding to that of the wafer W mounted on the mounting table 5. The electrode 7 may be made of a conductive material, e.g., molybdenum, tungsten or the like, which has approximately the same thermal expansion coefficient as that of the material (AlN) of the mounting table 5. The electrode 7 may be formed in, e.g., a mesh shape, a lattice shape, a spiral shape or the like.

Moreover, a cover 8a is provided so as to cover a side surface and a peripheral portion of a top surface of the mounting table 5, and a groove for guiding the wafer W is formed at the cover 8a. Further, an annular baffle plate 8b made of quartz is disposed at the outer periphery of the mounting table 5 in order to uniformly evacuate the inside of the processing chamber 1. The baffle plate 8b has a plurality of openings 8c and is supported by a support (not shown).

Furthermore, a plurality of wafer supporting pins (not shown) for supporting and vertically moving the wafer W is provided at the mounting table 5. The wafer supporting pins can be protruded from and retracted into the surface of the mounting table 5.

Sealing members 9a to 9c such as O-rings and the like are provided at an upper and a lower connection portion of the second chamber 3, so that the airtightness of the connection portions can be maintained. The sealing members 9a to 9c are made of a fluorine-based rubber material, e.g., Kalrez (Trademark of DuPont) or the like.

A circular opening 10 is formed at an approximately central portion of a bottom wall 2a of the first chamber 2. The opening 10 is covered by the gas exhaust chamber 11 for uniformly evacuating the inside of the processing chamber 1, the gas exhaust chamber 11 extending downward from the bottom wall 2a while communicating with the opening 10.

As shown in the enlarged view of FIG. 2, a plurality of gas supply lines 12 is vertically disposed at certain locations in the first chamber 2 (e.g., locations for uniformly dividing the first chamber 2 into four parts along the circumferential direction). The gas supply lines 12 are connected to an annular passage 13 formed by a gap between the first chamber 2 and the second chamber 3. A plurality of gas passages 14 connected to the annular passage 13 is formed in the second chamber 3.

Besides, gas inlet ports 15a are uniformly disposed at a plurality of (e.g., thirty-two) locations of the upper portion of the second chamber 3 along the inner peripheral surface of the second chamber 3. Gas inlet lines 15b are horizontally extended from the gas inlet ports 15a and communicate with the gas passages 14 formed vertically in the second chamber 3.

The annular passage 13 is formed by step portions 18 and 19 at a connection portion between an upper end surface of the first chamber 2 and a lower end surface of the second chamber 3. The annular passage 13 is annularly extended in an approximately horizontal plane so as to surround the inner space of the processing chamber 1. The annular passage 13 is connected to a gas supply unit 16 via a gas supply line 12 at a bottom portion of the processing chamber 1.

Moreover, the gas supply unit 16 may be connected to a side surface of the processing chamber 1. The annular passage 13 serves as a gas distribution unit for uniformly distributing and supplying a gas into the gas passages 14, and prevents a processing gas from being unevenly distributed to a specific gas inlet port 15a.

As described above, in this embodiment, the gas from the gas supply unit 16 passes through the gas supply lines 12, the annular passage 13 and the gas passages 14 and then is uniformly introduced into the processing chamber through the gas inlet ports 15a provided at thirty-two locations without pressure loss in the lines. Accordingly, the uniformity of the plasma in the processing chamber 1 can be increased.

In addition, the step portion 19 provided at the lower end surface of the second chamber 3 can form the annular passage 13 together with the step portion 18 provided at the upper end surface of the first chamber 2. In other words, the annular passage 13 is formed by the step portion 18 of the upper end surface of the sidewall of the first chamber 2 and the step portion 19 of the lower end surface of the second chamber 3.

In this embodiment, the height of the step portion 19 is higher than that of the step portion 18. Thus, when the lower end surface of the second chamber 3 is connected to the upper end surface of the first chamber 2, a protruded surface 3b of the step portion 19 is adhered to a non-protruded surface 2a of the step portion 18 at the sealing member 9b side. However, a non-protruded surface 3c of the step portion 19 is not adhered to a protruded surface 2b of the step portion 18 at the sealing member 9a side, so that a small gap S is formed therebetween.

The sealing member 9a serves as a second sealing member maintaining airtightness which makes it possible to prevent a gas from leaking to the outside. The sealing member 9b serves as a first sealing member and maintains airtightness of the processing chamber 1 by sealing the protruded surface 3b of the step portion 19 and the non-protruded surface 2a of the step portion 18 which are adhered to each other. Since the protruded surface 3b of the step portion 19 and the non-protruded surface 2a of the step portion 18 are in contact with each other, the return circuit of the high frequency current is effectively formed as will be described later. Thus, surface potential of an opposite electrode (a lid portion 27 serving as a second electrode) is decreased, and the opposite electrode cannot easily be made to sputter. The operation of the connected structure will be described later.

A gas exhaust line 23 is connected to a side surface of the gas exhaust chamber 11, and a gas exhaust unit 24 including a vacuum pump is connected to the gas exhaust line 23. When the gas exhaust unit 24 operates, the gas in the processing chamber 1 is uniformly discharged to a space 11a of the gas exhaust chamber 11 and is exhausted through the gas exhaust line 23. Accordingly, the pressure in the processing chamber 1 can be rapidly lowered down to a predetermined vacuum level, e.g. about 0.133 Pa.

Provided at the sidewall of the first chamber 2 are a loading/unloading port for loading and unloading the wafer W and a gate valve for opening and closing the loading/unloading port (all not shown).

An opening is formed at a top portion of the processing chamber 1, and the microwave introducing unit 26 is airtightly installed to block the opening. The microwave introducing unit 26 can be opened and closed by an opening/closing mechanism (not shown).

The microwave introducing unit 26 includes a lid portion 27, a transmitting plate 28, a planar antenna 31 and a wave retardation member 33 which are provided in that order from the mounting table 5. Such members are covered by a conductive cover 34 made of, e.g., stainless steel, aluminum, aluminum alloy or the like, and the conductive cover 34 is supported by a support member 36 and fixed to the lid portion 27 together with the support member 36 by an annular pressing ring 35.

The lid portion 27 serves as an opposite electrode provided to face the electrode 7 of the mounting table 5 serving as a lower electrode. When the microwave introducing unit 26 is installed at the processing chamber 1, the top portion of the processing chamber 1 is sealed to the lid portion 27 having an opening/closing function with the sealing member 9c, and the transmitting plate 28 is supported by the lid portion 27, as will be described later. Moreover, a plurality of cooling water paths 27b is formed at a peripheral portion of the lid portion 27. By using the cooling water paths 27b to cool the lid portion 27, it is possible to prevent misalignment of the connection portion due to thermal expansion caused by the heat of the plasma. As a consequence, decrease of sealability or generation of particles can be prevented.

The transmitting plate 28 serving as a dielectric plate is made of a dielectric material such as quartz, ceramic, e.g., $Al_2O_3$, AlN, sapphire, SiN or the like, and acts as a microwave introducing window for introducing a microwave into the processing space in the processing chamber 1 by transmitting the microwave. The bottom surface of the transmitting plate 28 (facing the mounting table 5) is not limited to be necessarily flat. For example, a recess or a groove may be formed to stabilize the plasma by suppressing reflection of the microwave and making the plasma uniform.

A protrusion 27a protruded toward the inner space of the processing chamber 1 is formed at an inner peripheral surface of the annular lid portion 27, and a bottom surface of a peripheral portion of the transmitting plate 28 is airtightly supported on the protrusion 27a by a sealing member 29. Accordingly, when the microwave introducing unit 26 is installed at the processing chamber 1, the inside of the processing chamber 1 can be maintained in an airtightly sealed state.

The planar antenna 31 has a circular plate shape. The planar antenna 31 is provided on the transmitting plate 28 and fixed by a bottom surface of a peripheral portion of the cover 34 made of a conductive material such as a metal or the like. The planar antenna 31 is made of, e.g., a copper plate having a surface plated with gold or silver, an aluminum plate, a nickel plate, or a brass plate. A plurality of slot holes 32 penetrating through the planar antenna 31 is formed therein to thereby radiate an electromagnetic wave such as a microwave or the like. A plurality of pairs of slots, each pair being formed by two slot-shaped holes 32, is arranged in a predetermined pattern.

As shown in FIG. 3, each of the slot holes 32 has an elongated groove shape. Typically, two adjacent slot holes 32 are arranged in a "T" shape and form a pair of slots. A plurality of such pairs is arranged in concentric circles. A length or an arrangement interval of the slot holes 32 is determined by a wavelength ($\lambda g$) of a microwave. For example, the slot holes 32 may be arranged at intervals of $\lambda g/4$ to $\lambda g$.

Referring to FIG. 3, an interval between adjacent slot holes 32 on different adjacent concentric circles is indicated by $\Delta r$. Further, each of the slot holes 32 may have another shape such as a circular arc shape or the like. No particular limitation is imposed on the arrangement of the slot holes 32. For example, the slot holes 32 may be arranged in a spiral or a radial pattern without being limited to the concentric circular pattern.

The wave retardation member 33 having a larger dielectric constant than that of a vacuum is provided on a top surface of the planar antenna 31. The wave retardation member 33 may be made of, e.g., quartz, ceramics, fluorine-based resin such as polytetrafluoroethylene or the like, or polyimide-based resin. Since the wavelength of the microwave is increased in a vacuum, the wave retardation member 33 functions to shorten the wavelength of the microwave to thereby control the plasma. Although there may exist a gap between the planar antenna 31 and the transmission plate 28 and between the retardation member 33 and the planar antenna 31, it is preferable that there is no gap therebetween.

Cooling water paths 34a are formed in the cover 34. By circulating cooling water through the cooling water paths 34a, the cover 34, the wave retardation member 33, the planar antenna 31, the transmitting plate 28 and the annular lid portion 27 are cooled. Thus, the plasma can be stably generated while preventing deformation or breakage of the components. The planar antenna 31 and the cover 34 are grounded.

As shown in FIG. 1, an opening 34b is formed at the center of the cover 34, and a waveguide 37 is connected to the opening 34b. A microwave generator 39 is connected to an end portion of the waveguide 37 via a matching circuit 38. Accordingly, a microwave having a frequency of, e.g., 2.45 GHz, which is generated by the microwave generator 39, propagates to the planar antenna 31 via the waveguide 37. The microwave may have a frequency of 8.35 GHz, 1.98 GHz, or the like.

The waveguide 37 includes a cylindrical coaxial waveguide 37a extending upward from the opening 34b of the cover 34, and a horizontally extending rectangular waveguide 37b connected to an upper end portion of the coaxial waveguide 37a via a mode transducer 40. The mode transducer provided between the coaxial waveguide 37a and the rectangular waveguide 37b functions to convert a microwave propagating in a TE mode through the rectangular waveguide 37b into a TEM mode microwave.

An inner conductor 41 extends in the center of the coaxial waveguide 37a from the mode transducer 40 to the planar antenna 31, and a lower end of the inner conductor 41 is fixedly connected to the center of the planar antenna 31. Further, a flat waveguide is formed by the planar antenna 31 and the cover 34. Accordingly, the microwave efficiently propagates through the planar antenna 31 in a radial direction via the inner conductor 41 of the coaxial waveguide 37a.

The electrode 7 embedded in the mounting table 5 is connected to a power supply line 42 passing through the support 4. Further, the power supply line 42 is connected to a high frequency power supply 44 for bias application via a matching box (MB) 43 having a matching circuit. Hence, a high frequency bias can be applied to the wafer W.

As described above, the filter box 45 is provided in the power supply line 6a to supply power from the heater power supply 6 to the heater 5a. Further, the matching box 43 and the filter box 45 are connected to each other via the shield box 46 and form a unit which is installed at a bottom portion of the gas exhaust chamber 11 of the processing chamber 1.

The shield box 46 is made of a conductive material, e.g., aluminum, stainless steel or the like. A conductive plate 47, which is made of, e.g., copper or the like and connected to the power supply line 42, is installed in the shield box 46 and connected to a matcher (not shown) in the matching box 43. By using the conductive plate 47, the poor contact hardly occurs, and the contact area with the power supply line 42 can be increased. Further, the current loss at the connection portion can be reduced.

Conventionally, the shield box 46 is not provided, and the matching box 43 and the power supply line 42 which are exposed to the outside are connected to each other by a coaxial cable or the like. For that reason, a loss of high frequency power occurs at the coaxial cable or the like. Further, the high frequency current flows from the mounting table 5 to the opposite electrode (in this case, e.g., the lid portion 27 can serve as the opposite electrode) via the plasma generation space and then flows back to the earth of the high frequency power supply 44 via the second chamber 3 and the first chamber 2 of the processing chamber 1 and the wall of the gas exhaust chamber 11. Herein, a resistance increases in proportion to the length of the coaxial cable.

Similarly, when the filter box 45 and the power supply line 6a are connected to each other by the coaxial cable exposed to the outside, a power loss occurs at the coaxial cable. Due to the power loss, an abnormal current path is formed such that the high frequency power supplied from the high frequency power supply 44 to the electrode 7 flows from the electrode 7 toward the heater 5a and the power supply line 6a instead of flowing toward the lid portion 27 serving as the opposite electrode. Thus, the high frequency current path (RF return circuit to be described later) is not stably formed, and the abnormal discharge occurs.

To that end, in the plasma oxidation processing apparatus 100 of the present embodiment, the matching box 43 and the filter box 45 are connected to each other by the shield box 46, thereby forming one unit which is directly connected to the bottom portion of the gas exhaust chamber 11. Accordingly, the loss in the power from the high frequency power supply 44 can be reduced, and the power consumption efficiency can be increased. Further, the installation space can be reduced.

Meanwhile, the inner surface of the lid portion 27 which faces the plasma generation region near the transmitting plate 28 for transmitting a microwave is exposed to a strong plasma and is sputtered to thereby be worn. To solve this problem, as shown in the enlarged view of FIG. 2, it is preferable to coat a protection film, e.g., a $Y_2O_3$ film 48, on the surface of the protrusion 27a of the lid portion 27 serving as an opposite electrode to the mounting table 5 (i.e., the electrode).

The $Y_2O_3$ film 48 protects the surface of the lid portion 27 from the effects of sputtering and oxidation by the plasma and suppresses occurrence of contamination caused by a metal, e.g., aluminum or the like, forming the lid portion 27. Further, the high frequency current path is stably formed and maintained such that the high frequency power flows from the mounting table 5 toward the lid portion serving as an opposite electrode via the plasma generation space. Thus, the occurrence of short-circuit or abnormal discharge at other portions can be prevented.

The protection film may be made of metal oxide, e.g., $Al_2O_3$, $TiO_2$ or the like, other than $Y_2O_3$. Moreover, the adhesivity of the film can be improved by roughening the surface of the opposite electrode by performing a sand blast process before formation of a dielectric film such as a $Y_2O_3$ film or the like on the surface of the opposite electrode. Alternatively, an undercoat of a metal such as Ni or the like may be formed before the film formation.

To that end, it is preferable to form a dense $Y_2O_3$ film 48 having a low porosity at the lid portion 27. As the porosity of the $Y_2O_3$ film 48 is increased, the volume resistivity is increased. Therefore, the porosity is preferably within the range of about 1% to 10%. The $Y_2O_3$ film 48 has a thickness ranging from about 10 μm to 800 μm, preferably from about 50 μm to 500 μm, and more preferably from about 50 μm to 150 μm. When the thickness of the $Y_2O_3$ film 48 is smaller than about 10 μm, sufficient protection effect is not obtained. When the thickness of the $Y_2O_3$ film 48 is greater than about 800 μm, cracks or peeling easily can occur due to the stress of the film.

The $Y_2O_3$ film 48 may be formed by a thin film formation technique such as PVD (physical vapor deposition) or CVD (chemical vapor deposition), or thermal spraying. Preferably, the thermal spraying is used because it can easily form a film having a desired porosity and volume resistivity at a low cost. The thermal spraying includes frame thermal spraying, arc thermal spraying, laser thermal spraying, plasma thermal spraying and the like. In view of forming a high-purity film with high controllability, it is preferable to use the plasma thermal spraying. The plasma thermal spraying includes atmospheric pressure plasma thermal spraying, vacuum plasma thermal spraying and the like.

In the plasma oxidation processing apparatus 100 of the present embodiment, cylindrical insulating liners made of quartz are provided at the inner periphery of the processing chamber 1. The liners include an upper liner 49a serving as a first insulating plate and a lower liner 49b serving as a second insulating plate. The upper liner 49a covers the upper portion of the processing chamber 1, mainly the inner surface of the second chamber 3. The lower liner 49b extending from the upper liner 49a covers the lower portion of the processing chamber 1, mainly the inner surface of the first chamber 2.

The upper liner 49a and the lower liner 49b insulate by preventing the contact between the plasma and the wall surface of the processing chamber 1 made of a metal. Accordingly, the metal contamination caused by the material forming the processing chamber 1 is prevented, and the abnormal discharge or the short-circuit in which the high frequency current flows from the mounting table 5 toward the sidewall of the processing chamber 1 is prevented. It is preferable that the lower liner 49b located relatively close to the mounting table 5 has a thickness greater than that of the upper liner 49a. The thickness of the liner is set, in consideration of an impedance, such that abnormal discharge or short-circuit of the high frequency current does not occur.

The lower liner 49b covers at least a part of the inner surface of the gas exhaust chamber 11 and a portion of the inner surface of the first chamber 2 which is lower than a height of the mounting table 5 in which the electrode 7 is embedded. This is because the distance between the first chamber 2 and the mounting table 5 is minimized at the portion of the first chamber 2 which is lower than the height of the mounting table 5, and the occurrence of abnormal discharge at that portion needs to be prevented. The upper liner 49a and the lower liner 49b are preferably made of quartz. However, it is also possible to use a dielectric material such as ceramic, e.g., $Al_2O_3$, AlN, $Y_2O_3$ or the like. Moreover, the upper liner 49a and the lower liner 49b may be formed by coating an insulating material on the first chamber 2 and the second chamber 3.

Figure 4:
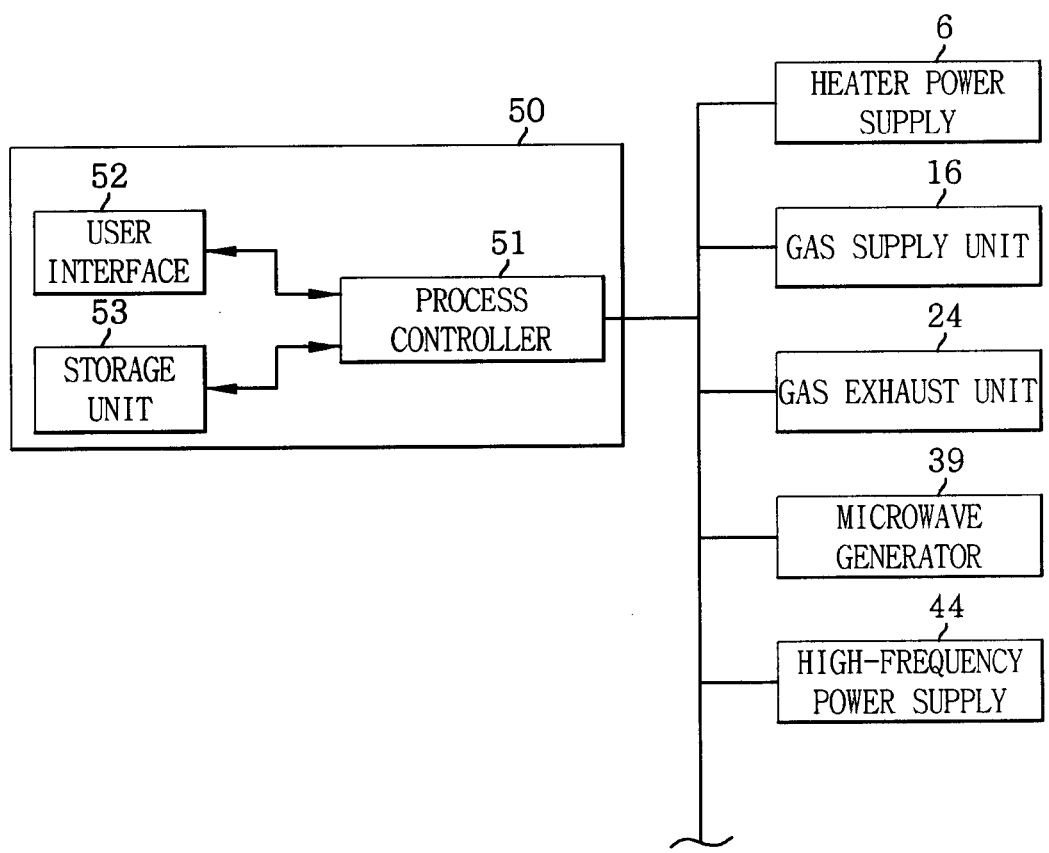
FIG. 4 is a view for explaining a structure of a control unit.

As shown in FIG. 4, each component of the plasma oxidation processing apparatus 100 is connected to and controlled by a control unit 50. The control unit 50 generally includes a computer. The control unit 50 includes a process controller 51 having a CPU, a user interface 52 and a storage unit 53 which are connected to the process controller 51. The process controller 51 serves as control means for entirely controlling each component (e.g., the heater power supply 6, the gas supply unit 16, the gas exhaust unit 24, the microwave generator 39, the high frequency power supply 44 and the like) of the plasma oxidation apparatus 100 which is related to the processing conditions such as a temperature, a pressure, a gas flow rate, a microwave output, a high frequency power for bias application and the like.

The user interface 52 has a keyboard where a process manager inputs commands for managing the plasma oxidation processing apparatus 100, a display for displaying operation statuses of the plasma oxidation processing apparatus 100, and the like. Further, the storage unit 53 stores recipes including control programs (software) for implementing various processes in the plasma oxidation processing apparatus 100 under the control of the process controller 51, processing condition data and the like.

If necessary, the process controller 51 executes a recipe read from the storage unit 53 in accordance with an instruction from the user interface 52 or the like, and thereby a desired process is performed in the processing chamber 1 of the plasma oxidation apparatus 100 under the control of the process controller 51. Further, the control programs and the recipes can be obtained from a computer-readable storage medium such as a CD-ROM, a hard disk, a flexible disk, a flash memory, a DVD, a blue-ray disk or the like. Moreover, the recipes may be transmitted from another apparatus via, e.g., a dedicated line.

With the plasma oxidation processing apparatus 100 configured as described above, the plasma oxidation process can be performed without damaging a base film or a substrate (wafer W) at a low temperature ranging from a room temperature (about 25° C.) to 600° C. Further, the plasma oxidation processing apparatus 100 ensures high uniformity of a plasma, so that even a wafer W (target object) having a large diameter can be uniformly processed.

Hereinafter, the operation of the plasma oxidation processing apparatus 100 will be described. First of all, the wafer W is loaded into the processing chamber 1 and mounted on the mounting table 5. Then, as a processing gas, a rare gas such as Ar, Kr, He or the like and an oxidizing gas such as $O_2$, $N_2O$, NO, $NO_2$, $CO_2$ or the like are introduced at predetermined flow rates from the gas supply unit 16 into the processing chamber 1 via the gas inlet ports 15*a*. If necessary, $H_2$ may be added.

Next, a microwave from the microwave generator 39 is transmitted to the waveguide 37 through the matching circuit 38 and sequentially passes through the rectangular waveguide 37*b*, the mode transducer 40 and the coaxial waveguide 37*a*. Thereafter, the microwave is supplied to the planar antenna 31 via the inner conductor 41 and radiated through the slot holes 32 of the planar antenna 31 into the processing chamber 1 via the transmitting plate 28.

The microwave propagates in the TE mode in the rectangular waveguide 37*b*, and the TE mode microwave is converted into a TEM mode microwave by the mode transducer 40. The TEM mode microwave propagates within the coaxial waveguide 37*a* toward the planar antenna 31. An electromagnetic field is formed in the processing chamber 1 by the microwave radiated from the planar antenna 31 into the processing chamber 1 via the transmission plate 28, and the processing gas is turned into a plasma.

Since the microwave is radiated from the plural slot holes 32 of the planar antenna 31, a plasma having a high density ranging from about $1 \times 10^{10}$ to $5 \times 10^{12}/cm^3$ can be obtained and a low electron temperature plasma of about 1.5 eV can be obtained in vicinity of the wafer W. By applying this plasma to the wafer W, the processing can be carried out while reducing plasma damages.

Further, in the present embodiment, the high frequency power having a predetermined frequency is supplied from the high frequency power supply 44 to the electrode 7 of the mounting table 5 during the plasma processing. For example, the frequency of the high frequency power supplied from the high frequency power supply 44 preferably ranges from 100 kHz to 60 MHz and more preferably from 400 kHz to about 13.5 MHz. The density of the high frequency power per area of the wafer W ranges preferably, e.g., from 0.2 $W/cm^2$ to 2.3 $W/cm^2$, and more preferably from 0.35 $W/cm^2$ to 1.2 $W/cm^2$.

Besides, the power of the high frequency is preferably within the range between 200 W and 2000 W and more preferably within the range between 300 W and 1200 W. The high frequency power supplied to the electrode 7 of the mounting table 5 has a function of attracting ion species in the plasma toward the wafer while maintaining the low electron temperature of the plasma. Therefore, when the bias is applied to the wafer W by supplying the high frequency power to the electrode 7, the plasma oxidation rate can be increased, and the uniformity of the intra-wafer surface processing can be improved.

Figure 5:
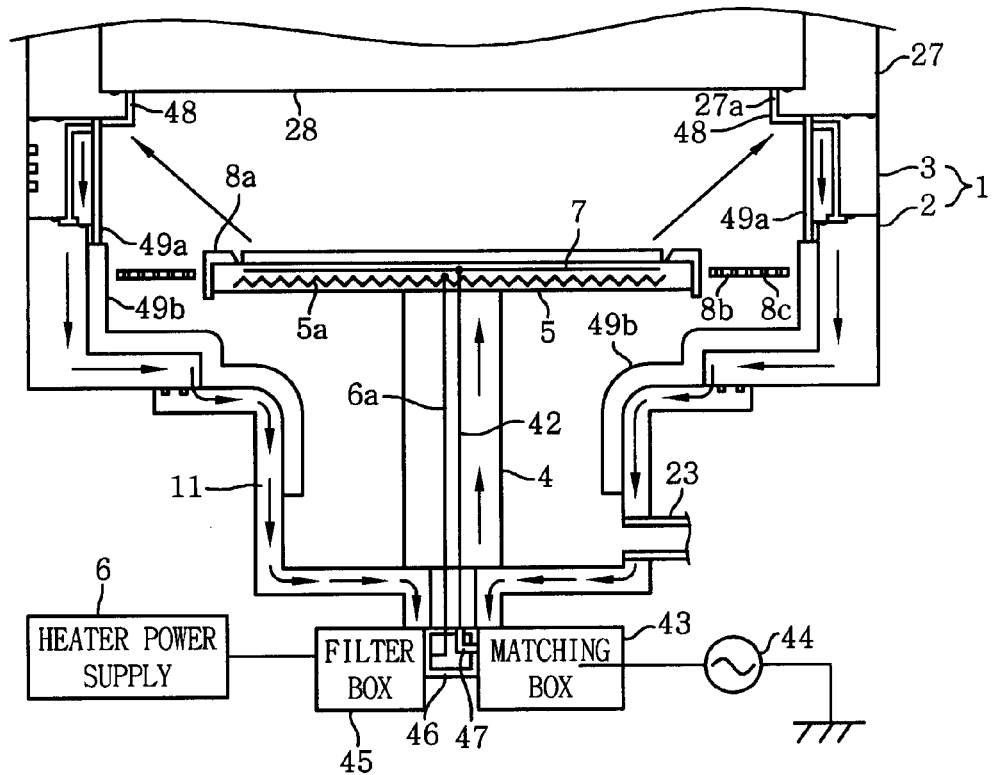
FIG. 5 represents a current path in the plasma oxidation processing apparatus.

As represented by arrows in FIG. 5, with the return circuit configuration of the present invention, the high frequency power is effectively supplied, without being reduced, from the high frequency power supply 44 to the electrode 7 of the mounting table 5 via the high frequency power introducing unit (the matching box 43 and the conductive plate 47 in the shield box 46) and the power supply line 42. The high frequency power supplied to the electrode 7 flows from the mounting table 5 toward the lid portion 27 serving as an opposite electrode via the plasma generation space and then flows toward the earth of the high frequency power supply 44 via the second chamber 3 and the first chamber 2 of the processing chamber 1 and the wall of the gas exhaust chamber 11. Thus, the high frequency current path (RF return circuit) is formed.

Figure 6:
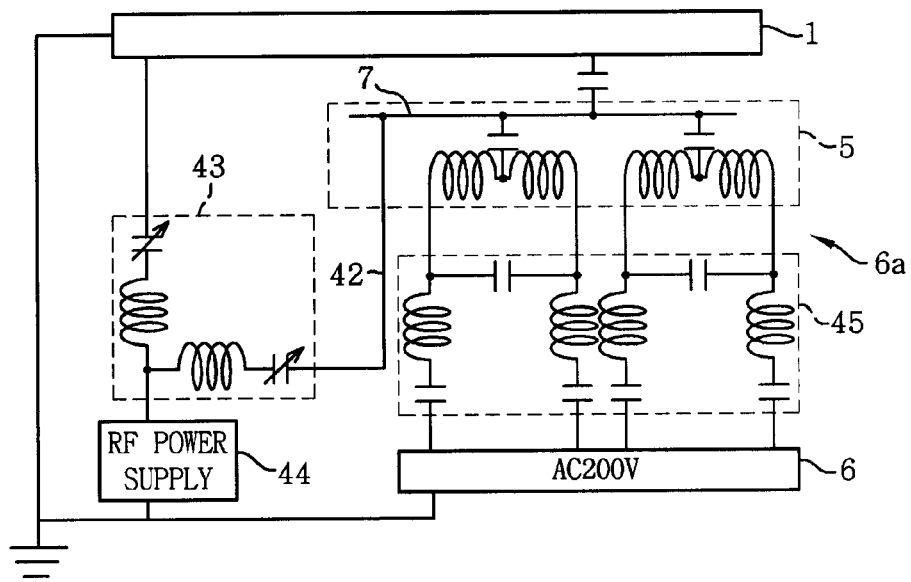
FIG. 6 depicts an equivalent circuit of an RF return circuit.

The equivalent circuit of the RF return circuit is shown in FIG. 6. In this embodiment, the thin $Y_2O_3$ film 48 is formed at a portion of the lid portion 27 serving as an opposite electrode which faces the plasma generation space. Thus, the formation of the high frequency current path in which the high frequency power flows from the mounting table 5 toward the lid portion 27 via the plasma processing space is not disturbed. Further, since the upper liner 49*a* and the lower liner 49*b* thicker than the upper liner 49*a* are installed at the inner surfaces of the second chamber 3 and the first chamber 2 adjacent to the $Y_2O_3$ film 48, short-circuit or abnormal discharge can be prevented from occurring at the portions where the upper liner 49*a* and the lower liner 49*b* are located.

The $Y_2O_3$ film 48 is hardly affected by abnormal discharge or sputtering caused by charge-up phenomenon. Further, since the $Y_2O_3$ film 48 has a high durability, the contamination by metal, e.g., aluminum or the like can be prevented for a long period of time. In other words, the abnormal discharge and the metal contamination can be prevented by the presence of the $Y_2O_3$ film 48.

With the present embodiment described above, when the second chamber 3 and the first chamber 2 are connected to each other, the protruded surface 3*b* of the step portion 19 and the non-protruded surface 2*a* of the step portion 18 are adhered to each other at the side close to the sealing member 9*b*. However, the non-protruded surface 3*c* of the step portion 19 and the protruded surface 2*b* of the step portion 18 are incompletely adhered to each other at the side close to the sealing member 9*a*, so that a small gap S is formed therebetween.

When the first chamber 2 and the second chamber 3 are connected by combining the step portions 18 and 19 as described in the present embodiment, it is difficult to bond all the facing surfaces due to a limit in the accuracy of processing dimensions. Therefore, only one of the two pairs of the protruded surface and the non-protruded surface of the step portions 18 and 19 is allowed to be adhered to each other by increasing a size of one of the step portions 18 and 19.

In a structure of a conventional processing chamber in which a high frequency bias power is not supplied to the mounting table 5, airtightness in the processing chamber 1 is ensured by the sealing member 9*a* positioned at the outer side of the annular passage 13 (the outer periphery of the annular passage 13). Thus, the protruded surface 2*b* of the step portion 18 and the non-protruded surface 3*c* of the step portion 19 are adhered to each other by the sealing member 9*a*. However, the non-protruded surface 2*a* of the step portion 18 and the protruded surface 3*b* of the step portion 19 are not completely adhered to each other by the sealing member 9*b*, so that a gap is formed therebetween. In this case, the inner sealing member 9*b* has a function of sealing a gas between the inside of the processing chamber 1 and the annular passage 13.

On the other hand, in the plasma oxidation processing apparatus 100 in which a high frequency bias power is supplied to the electrode 7 of the mounting table 5, the high frequency current path (RF return circuit) is formed such that the high frequency power supplied to the electrode 7 flows from the mounting table 5 toward the lid portion 27 serving as an opposite electrode via the plasma generation space and then flows toward the earth of the high frequency power supply 44 via the second chamber 3 and the first chamber 2 of the processing chamber 1 and the wall of the gas exhaust chamber 11, as described above.

At this time, the high frequency current is propagated as a surface current along the inner walls of the second chamber 3 and the first chamber 2. Hence, if a gap exists on the inner surfaces of the second chamber 3 and the first chamber 2, the current is blocked, and the high frequency current path becomes complicated and lengthened. Further, the stable formation of the high frequency current path may be disturbed by the abnormal discharge occurring at, e.g., corners of the step portion 18 and the step portion 19 or the like.

Therefore, in the present embodiment, the protruded surface 3b of the step portion 19 and the non-protruded surface 2a of the step portion 18 are adhered to each other at the sealing member 9b side, so that the high frequency current can efficiently flow along the inner surface of the processing chamber 1, i.e., the inner walls of the second chamber 3 and the first chamber 2. Further, a contact area between the protruded surface 3b of the step portion 19 and the non-protruded surface 2a of the step portion 18 is small. Accordingly, the contact pressure is increased, and the electrical conduction is stabilized.

As described above, in the plasma oxidation processing apparatus 100 in accordance with the present embodiment, the power consumption efficiency is improved by stabilizing the path of the high frequency bias power supplied to the electrode 7 of the mounting table 5 for mounting thereon the wafer W. Further, the processing efficiency can be increased by preventing abnormal discharge.

Next, (1) the aluminum contamination level and (2) the high frequency power dependency of the intra-wafer surface processing uniformity and the oxidation rate of silicon on the surface of the wafer W were compared between the case of performing a plasma oxidation process by an apparatus using the lid portion 27 made of aluminum and coated with the $Y_2O_3$ film 48 and the case of performing a plasma oxidation process by a conventional apparatus using a cover made of aluminum and uncoated with the $Y_2O_3$ film 48. The $Y_2O_3$ film 48 was formed at a thickness of about 80 μm by atmospheric plasma thermal spraying. Further, the $Y_2O_3$ film 48 had a purity of about 99%, a volume resistivity of about $3.6 \times 10^{10}$ $\Omega \cdot cm^2$, and a porosity of about 10%. It was found that when the cover was coated by the $Y_2O_3$ film 48, the aluminum contamination level was decreased and the in-plane uniformity of the oxidation process was improved compared to the conventional apparatus using the cover made of aluminum and uncoated with the $Y_2O_3$ film.

The present invention can be variously modified without being limited to the above-described embodiment. For example, in the above-described embodiment, a main body of the lid portion 27 exposed to a plasma is made of aluminum. However, the same effects can also be obtained in the case of using another metal such as stainless steel or the like. Further, various plasma processes such as a plasma nitriding process, a plasma etching process and the like, other than the plasma oxidation process, can be carried out as long as the high frequency power is supplied to the electrode 7 of the mounting table 5. Besides, a target object is not limited to a semiconductor wafer, and may be another substrate such as a glass substrate for use in FPD or the like.

What is claimed is:

1. A plasma processing apparatus comprising: a processing chamber having an opening at an upper portion thereof; a gas supply mechanism for supplying a processing gas into the processing chamber;
   a gas exhaust mechanism for exhausting while depressurizing an inside of the processing chamber;
   a mounting table for mounting thereon a target object in the processing chamber;
   a first electrode embedded in the mounting table for applying a bias to the target object;
   a lid portion engaged with the upper portion of the processing chamber, wherein the lid portion includes a second electrode disposed at least partially to be exposed to a plasma generation region in the processing chamber, the second electrode being made of a conductive material and being located apart from the first electrode by a plasma processing space;
   a dielectric plate for blocking the opening of the processing chamber while transmitting a microwave, the dielectric plate being supported by a protrusion on an inner peripheral surface of the lid portion; and
   a planar antenna, provided above the dielectric plate and connected to a microwave generator via a waveguide, for introducing the microwave into the processing chamber,
   wherein a protection film made of metal oxide is formed at a portion of a surface of the second electrode which faces the plasma generation region; an upper inner wall surface of the processing chamber is covered by a first insulating liner; and a lower inner wall surface of the processing chamber is covered by a second insulating liner,
   wherein the processing chamber has a first portion forming a lower side of the processing chamber, and a second portion connected to a top end surface of the first portion and forming an upper side of the processing chamber,
   wherein a gas passage through which the processing gas supplied from the gas supply mechanism to the processing chamber flows is formed between the first portion and the second portion,
   wherein a first sealing member and a second sealing member are provided at both sides of the gas passage, the first sealing member being provided at one side of the gas passage which is close to the inside of the processing chamber and the second sealing member being provided at the other side of the gas passage which is close to an outside of the processing chamber,
   wherein the first portion and the second portion are in contact with each other to provide a contacting portion at said one side of the gas passage, and are separated from each other with a gap at the other side of the gas passage,
   wherein a plurality of coolant paths are formed at the second portion and a peripheral portion of the lid portion,
   wherein coolant paths are configured to reduce difference of thermal expansion between the second portion and the peripheral portion of the lid portion so that misalignment therebetween caused by the difference is restrained, and
   wherein the contacting portion constitutes a part of a high frequency current path so that high frequency current supplied to the second electrode via the first electrode and the plasma generation region flows to the first portion via the second portion and the contacting portion.

2. The plasma processing apparatus of claim 1, wherein a thickness of the second insulating liner is greater than a thickness of the first insulating liner.

3. The plasma processing apparatus of claim 1, wherein the second insulating liner covers at least a part of an inner wall surface of a gas exhaust chamber connected to a bottom portion of the processing chamber.

4. The plasma processing apparatus of claim 1, wherein the gas passage is formed by stepped portions formed at an upper end surface of the first portion and a lower end surface of the second portion.

5. The plasma processing apparatus of claim 1, wherein the protection film is made of yttrium oxide.

6. The plasma processing apparatus of claim 5, wherein a porosity of the yttrium oxide is within the range from about 1% to 10%, and the protection film has a thickness ranging from about 10 µm to 800 µm.

7. The plasma processing apparatus of claim 1, wherein the dielectric plate, the first insulating liner and the second insulating liner are made of quartz.

8. The plasma processing apparatus of claim 1, wherein the contacting portion and the gap formed between the first and the second portion are provided by the difference between sizes of a stepped portion formed at an upper end surface of the first portion and a stepped portion formed at a lower end surface of the second portion.

9. A plasma processing apparatus comprising: a processing chamber having an opening at an upper portion thereof; a gas supply mechanism for supplying a processing gas into the processing chamber;
   a gas exhaust mechanism for exhausting while depressurizing an inside of the processing chamber;
   a mounting table for mounting thereon a target object in the processing chamber; a first electrode embedded in the mounting table for applying a bias to the target object;
   a lid portion engaged with the upper portion of the processing chamber, wherein the lid portion includes a second electrode disposed at least partially to be exposed to a plasma generation region in the processing chamber, the second electrode being made of a conductive material and being located apart from the first electrode by a plasma processing space;
   a dielectric plate for blocking the opening of the processing chamber while transmitting a microwave, the dielectric plate being supported by a protrusion on an inner peripheral surface of the lid portion;
   and a planar antenna, provided above the dielectric plate and connected to a microwave generator via a waveguide, for introducing the microwave into the processing chamber,
   wherein the processing chamber has
   a first portion forming a lower side of the processing chamber, and
   a second portion connected to a top end surface of the first portion and forming an upper side of the processing chamber,
   wherein a gas passage through which the processing gas supplied from the gas supply mechanism to the processing chamber flows is formed between the first portion and the second portion,
   wherein a first sealing member and a second sealing member are provided at both sides of the gas passage, the first sealing member being provided at one side of the gas passage which is close to the inside of the processing chamber and the second sealing member being provided at the other side of the gas passage which is close to an outside of the processing chamber,
   wherein the first portion and the second portion are in contact with each other to provide a contacting portion at said one side of the gas passage, and are separated from each other with a gap at the other side of the gas passage,
   wherein a plurality of cooling water paths are formed at the second portion and a peripheral portion of the lid portion,
   wherein coolant paths are configured to reduce difference of thermal expansion between the second portion and the peripheral portion of the lid portion so that misalignment therebetween caused by the difference is restrained, and
   wherein the contacting portion constitutes a part of a high frequency current path so that high frequency current supplied to the second electrode via the first electrode and the plasma generation region flows to the first portion via the second portion and the contacting portion.

10. The plasma processing apparatus of claim 9, wherein the gas passage is formed by stepped portions formed at an upper end surface of the first portion and a lower end surface of the second portion.

11. The plasma processing apparatus of claim 9, wherein the contacting portion and the gap formed between the first and the second portion are provided by the difference between sizes of a stepped portion formed at an upper end surface of the first portion and a stepped portion formed at a lower end surface of the second portion.

* * * * *